(12) United States Patent
Chang

(10) Patent No.: US 6,198,222 B1
(45) Date of Patent: Mar. 6, 2001

(54) PLASMA DISPLAY DEVICE WITH HEAT DISSIPATION CHANNELS

(75) Inventor: Shan-Han Chang, Hsin-Chun (TW)

(73) Assignee: Acer Display Technology, Inc., Hsinchu (TW)

( * ) Notice: Subject to any disclaimer, the term of this patent is extended or adjusted under 35 U.S.C. 154(b) by 0 days.

(21) Appl. No.: 09/143,450

(22) Filed: Aug. 28, 1998

(30) Foreign Application Priority Data

Jun. 15, 1998 (TW) .................................................. 87109436

(51) Int. Cl.[7] ....................................................... H01J 17/49
(52) U.S. Cl. ............................. 313/582; 313/584; 313/46
(58) Field of Search ................................. 313/46, 17, 582, 313/584

(56) References Cited

U.S. PATENT DOCUMENTS 4,771,365 * 9/1988 Cichocki et al. ..................... 361/387
5,869,919 * 2/1999 Sato et al. .............................. 313/17
5,971,566 * 10/1999 Tani et al. ............................. 362/294

* cited by examiner

Primary Examiner—Nimeshkumar D. Patel
Assistant Examiner—Karabi Guharay
(74) Attorney, Agent, or Firm—Winston Hsu

(57) ABSTRACT

The present invention relates to a plasma display device. The plasma display device comprises a rectangular plasma display panel for displaying images, a rectangular side frame installed along four sides of the plasma display device, a rectangular rear plate vertically installed on a rear aspect of the four sides of the side frame for protecting the plasma display device, and a supporting rack installed inside the side frame between the plasma display panel and the rear plate comprising a top beam, a bottom beam, and a plurality of vertical columns vertically installed between the top beam and bottom beam. The vertical spaces between neighboring vertical columns and the vertical spaces between the vertical columns and the left and right bars of the side frame are heat dissipation channels for directing the heat generated from the rear side of the plasma display panel upward and away from the plasma display device.

12 Claims, 3 Drawing Sheets

PLASMA DISPLAY DEVICE WITH HEAT DISSIPATION CHANNELS

BACKGROUND OF THE INVENTION

1. Field of the Invention

The present invention relates to a plasma display device, and more particularly, to a plasma display device with heat dissipation channels.

2. Description of the Prior Art

A common plasma display device has two major mechanical structures: an internal plasma display module and an external housing. The plasma display module comprises a plasma display panel made of two glass substrates, a metal plate, a metallic supporting rack, and a plurality of circuit boards. The supporting rack is formed by a plurality of metallic beams. The metal plate is installed on the front surface of the supporting rack. The plasma display panel is attached to the front surface of the metal plate by double sided tape. The plurality of circuit boards is installed at the rear side of the supporting rack. The housing is formed by a front frame and a rear frame. The front and rear frames of the housing protect the plasma display module.

Electric fans are often installed within the plasma display device for dissipating heat generated by the plasma display panel and the circuit boards during operation. The above mentioned plasma display device has the following disadvantages:

1. The metal plate and the supporting rack are very thick thus will block the internal air flow and make heat dissipation difficult.
2. Due to the complexity of the internal structure of the plasma display device, the electric fans can only effectively force the air flow through neighboring area, thus preventing full heat dissipation of the whole area.

SUMMARY OF THE INVENTION

It is therefore a primary objective of the present invention to provide a plasma display device with a heat dissipation channel to solve the aforementioned problems.

In a preferred embodiment, the present invention provides a plasma display device comprising:

a rectangular plasma display panel having a front side and a rear side, the front side of the plasma display panel being used for displaying images;

a rectangular side frame comprising upper, lower, left and right bars over which the plasma display panel is vertically installed at a front end of the four bars of the side frame, and the front side of the plasma display panel is facing in the same direction as the front end of the side frame;

a rectangular rear plate vertically installed in a rear end of the four bars of the side frame for protecting internal components of the plasma display device; and a supporting rack installed inside the side frame between the plasma display panel and the rear plate comprising a horizontal top beam fixed at the upper bar of the side frame, a horizontal bottom beam fixed at the lower bar of the side frame, and a plurality of vertical columns mounted between the top beam and bottom beam, the rear side of the plasma display panel being fixed on a front end of the plurality of vertical columns;

wherein vertical spaces between neighboring vertical columns and between the vertical columns and the left and right bars of the side frame are used as heat dissipation channels for upwardly dissipating heat generated from the rear side of the plasma display panel when displaying images away from the plasma display device.

It is an advantage of the present invention that the plasma display device has a very simple structure. The vertical columns of the supporting rack not only provide a strong support, but also form a plurality of heat dissipation channels for dissipating heat generated from the rear side of the plasma display panel and by the six circuit boards away from the plasma display device.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
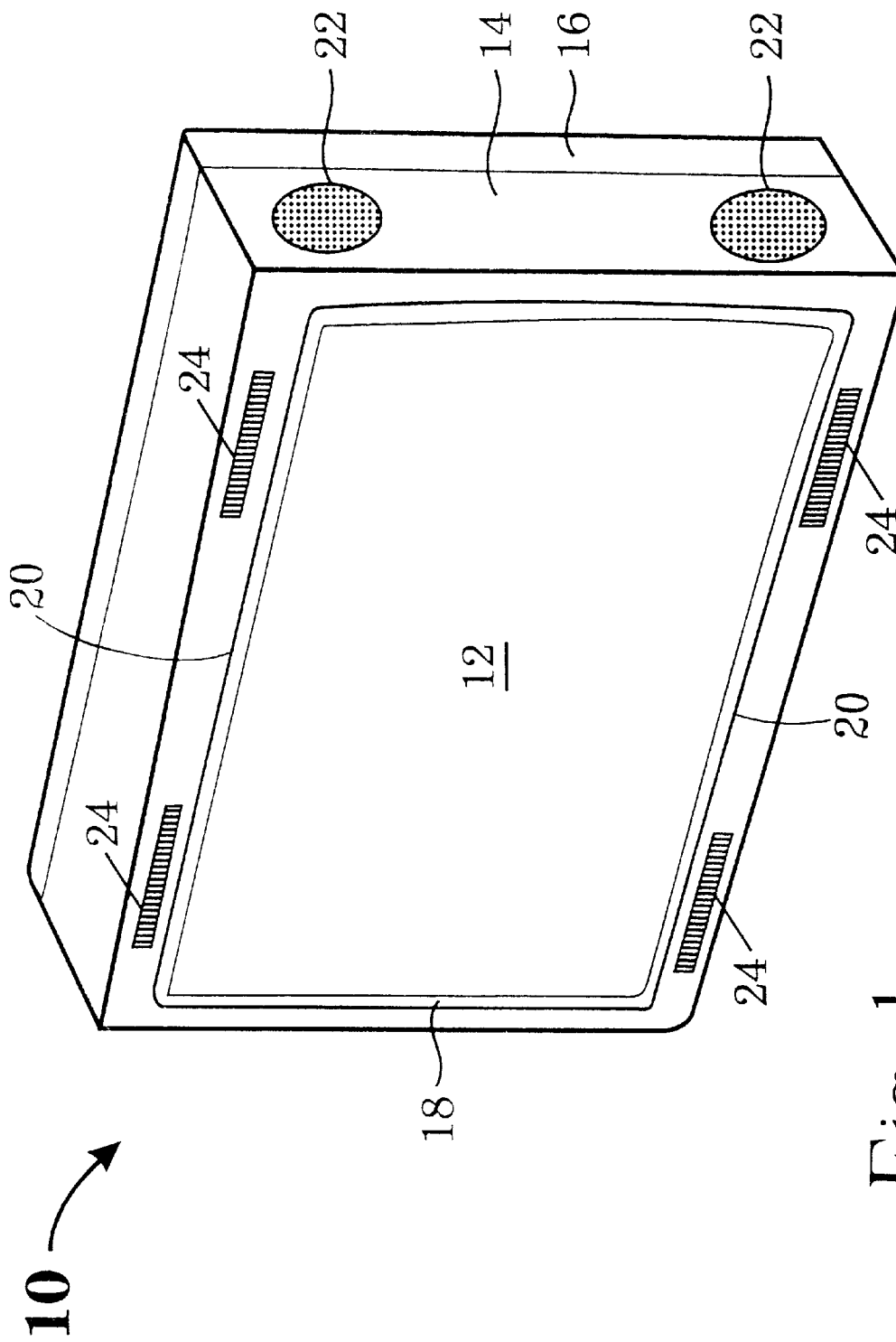
FIG. 1 is a perspective view of a plasma display device according to the present invention.
Figure 2:
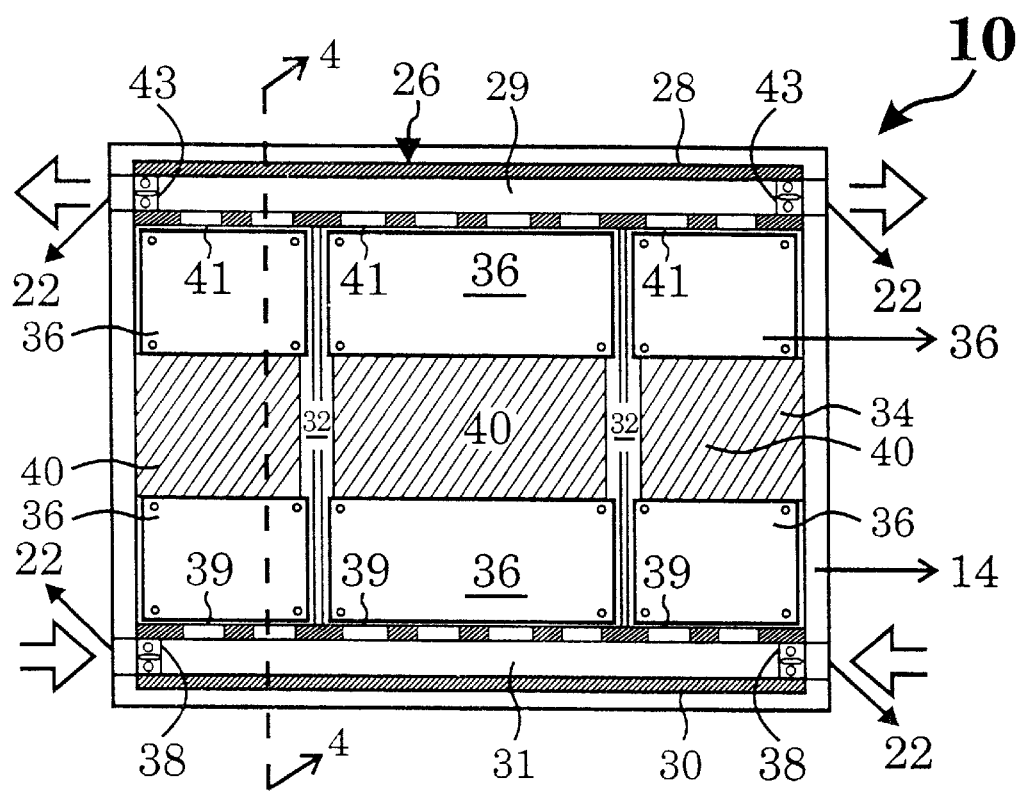
FIG. 2 is a rear view of the plasma display device shown in FIG. 1.
Figure 3:
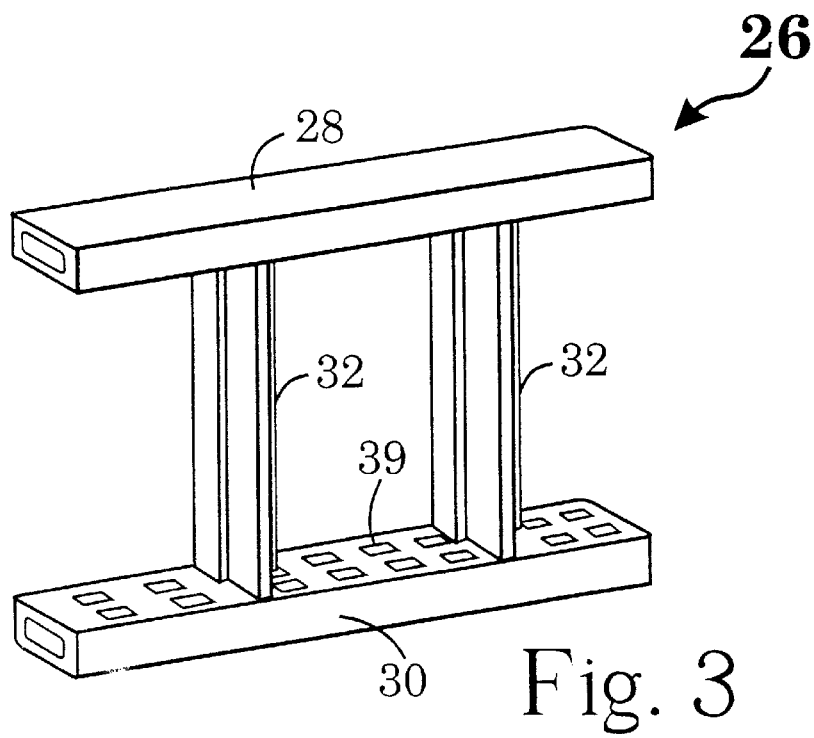
FIG. 3 is a perspective view of the supporting rack shown in FIG. 2.
Figure 4:
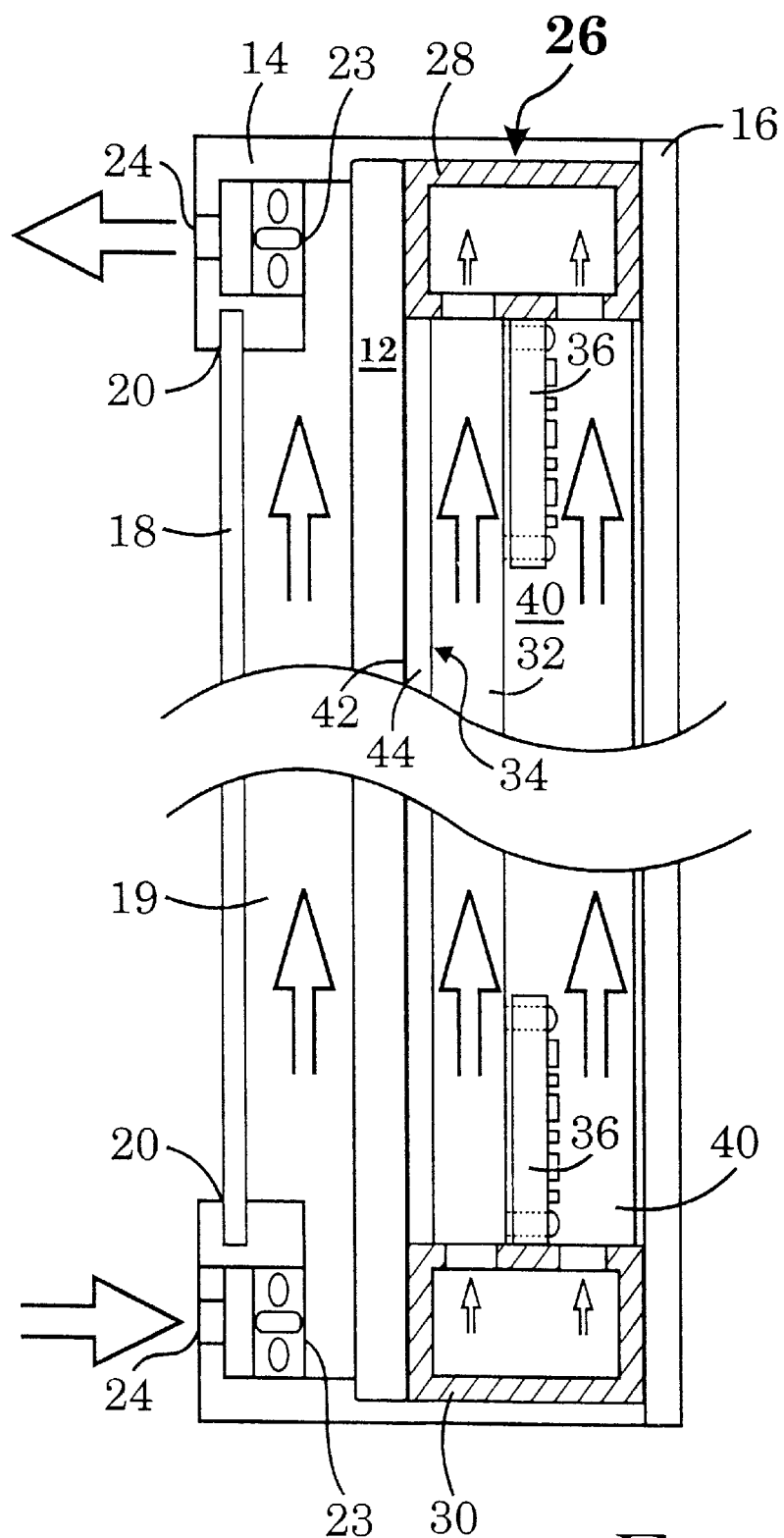
FIG. 4 is a sectional view along line 4—4 of the plasma display device shown in FIG. 2.

Please refer to FIG. 1. FIG. 1 is a perspective view of a plasma display device 10 according to the present invention. The plasma display device 10 comprises a rectangular plasma display panel 12, a rectangular side frame 14, a rectangular rear plate 16, and an electromagnetic wave filter 18. The plasma display panel 12 comprises a front surface and a rear surface, the video information being displayed on the front surface of the plasma display panel. The side frame 14 comprises upper, lower, left and right surfaces. The plasma display panel 12 is vertically installed in the side frame 14 and positioned over a front end of the side frame 14. The rear plate 16 is vertically installed in the side frame 14 and positioned over a rear end of the side frame 14 and protects the internal components of the plasma display device 10. The electromagnetic wave filter 18 is installed inside a plurality of paired grooves 20 at the front aspect of the side frame 14 for filtering the radiation and electromagnetic waves generated at the front surface of the plasma display panel 12. Each of the top and bottom ends of the left and right bars of the side frame 14 comprises a ventilation hole 22. A plurality of ventilation holes 24 are further installed above and below the plasma display panel 12 on the front sides of the side frame 14. Please refer to FIGS. 2 to 4. FIG. 2 is a rear view of the plasma display device 10 without the rear plate 16. FIG. 3 is a perspective view of a supporting rack 26 of the plasma display device 10. FIG. 4 is a sectional view along line 4—4 of the plasma display device 10. FIGS. 2 to 4 show the structure of the internal components of the plasma display device 10. The plasma display device 10 comprises a supporting rack 26, a heat dissipation layer 34, six rectangular circuit boards 36, an electromagnetic wave filter 18, and a plurality of electric fans 38, 43, 23.

The supporting rack 26 is installed inside the side frame 14 between the plasma display panel 12 and the rear plate 16 for vertically supporting the plasma display panel 12. The supporting rack 26 comprises a top beam 28 horizontally installed on the upper surface of the side frame 14, a bottom beam 30 horizontally installed on the lower surface of the side frame 14, and two vertical columns 32 vertically installed between the top beam 28 and bottom beam 30. The rear side of the plasma display panel 12 directly adheres to the front side of the two vertical columns 32 by adhesive material such as heat-resistant double sided tape. A vertical space 40 between the two vertical columns 32 and between the two vertical columns 32 and the left and right surfaces of the side frame 14 are used as heat dissipation channels which upwardly dissipate heat generated inside the plasma display device 10.

The bottom beam 30 comprises an air ventilation channel 31. Each of left and right sides of the air ventilation channel 31 comprises an electric fan 38 for pumping external cold air through the ventilation holes 22 into the air ventilation channel 31. An upper surface of the bottom beam 30 comprises a plurality of ventilation holes 39 for guiding the cold air inside the air ventilation channel 31 into the three heat dissipation channels 40. The top beam 28 also comprises an air ventilation channel 29. The lower side of the top beam 28 comprises a plurality of ventilation holes 41 for guiding the hot air in the three heat dissipation channels 40 into the air ventilation channel 29. Each of left and right sides of the air ventilation channel 29 comprises an electric fan 43 for pumping hot air on top of the heat dissipation channels out of the plasma display device 10.

The heat dissipation layer 34 is attached to the rear surface of the plasma display panel 12 for speeding up the dissipation of the heat generated by the plasma display panel 12 to the heat dissipation channels 40. The heat dissipation layer 34 comprises an aluminum foil layer 42 and a metallic blanket 44 with spikes on one surface. The aluminum foil layer 42 has good EMI shielding and reflects light thus improving the brightness of a backlight panel (not shown) used for emitting light to the plasma display panel 12. Furthermore, the aluminum foil layer 42 can rapidly transfer the heat generated by the plasma display panel 12 to the metallic blanket 44 which then directly dissipates the heat into the three heat dissipation channels 40.

The six rectangular circuit boards 36 are used for controlling image displays of the plasma display panel 12. The circuit boards 36 are vertically installed between the two vertical columns 32 and left and right bars of the side frame 14 within the three heat dissipation channels 40 so heat generated by the circuit boards 36 is dissipated through the heat dissipation channels 40.

The electromagnetic wave filter 18 is fixed at the front bar of the side frame 14 for filtering the electromagnetic radiation emitted from the front side of the plasma display panel 12. The electromagnetic wave filter 18 and the plasma display panel 12 has a closed space 19 between them. The heat generated from the front surface of the plasma display panel 12 directly enters this closed space 19. Two electric fans 23 are installed at the bottom surface of the closed space 19 for pumping external cold air into the closed space 19 through the two ventilation holes 24 at the bottom of a front side of the plasma display device 10. A top surface of the closed space 19 further comprises two electric fans 23 installed for pumping hot air inside the closed space 19 away from the plasma display device 10 through the two ventilation holes 24 on top of the front side of the plasma display device 10.

When operating the plasma display device 10, the electric fans 38 at two surfaces of the bottom beam 30 pump the outside cold air in and upward through the plurality of ventilation holes 39 on the upper surface of the bottom beam 30 thus distributing the cold air evenly inside the heat dissipation channels 40. The surface temperature of the circuit boards 36 is thus lowered and the heat released by the heat dissipation layer 34 and the plurality of circuit boards 36 is conducted upward through the plurality of ventilation holes 41 on the lower side of the top beam 28 into the top beam 28. The heat inside the top beam 28 is then dissipated by the electric fans 43 at two ends of the top beam 28 thus forming an air circulation loop inside the plasma display device 10. In the same manner, the external cold air is pumped into the closed space 19 through the plurality of ventilation holes 24 at the bottom of the front side of the side frame 14. The heat inside the closed space 19 is dissipated through the plurality of ventilation holes 24 at the top of the front side of the side frame 14 forming another air circulation loop.

Compared with the complicated mechanical structure of the prior art plasma display device, the plasma display device 10 has a very simple structure. The two vertical columns 32 of the supporting rack 26 not only provide a strong support, but also form three heat dissipation channels 40 for dissipating heat generated from a rear side of the plasma display device 10 and heat generated by the six circuit boards 36 away from the plasma display device 10.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A plasma display device comprising:
   a plasma display panel having a front side and a rear side, the front side of the plasma display panel being used for displaying images;
   a rectangular side frame comprising upper, lower, left and right bars over which the plasma display panel is vertically installed at a front end of the four bars of the side frame, and the front side of the plasma display panel is facing in the same direction as the front end of the side frame;
   a rear plate vertically installed in a rear end of the four bars of the side frame;
   a supporting rack installed inside the side frame between the plasma display panel and the rear plate comprising a horizontal top beam fixed at the upper bar of the side frame, a horizontal bottom beam fixed at the lower bar of the side frame, and a plurality of vertical columns mounted to the top beam at an upper end of each vertical column and to the bottom beam at a lower end of each vertical column so as to provide strong support, the rear side of the plasma display panel being fixed on a front end of at least one of the vertical columns;
   wherein vertical spaces between neighboring vertical columns and between the vertical columns and the left and right sides of the side frame are used as heat dissipation channels for upwardly dissipating heat generated from the rear side of the plasma display panel away from the plasma display device.

2. The plasma display device of claim 1 further comprising at least one rectangular circuit board electrically connected to the plasma display panel and vertically mounted inside one of the heat dissipation channels for controlling image displays of the plasma display device wherein the heat generated by the circuit board is dissipated upward through the heat dissipation channel away from the plasma display device.

3. The plasma display device of claim 1 wherein the plasma display panel is installed on the supporting rack by using adhesive material which fixes the rear side of the plasma display panel to the front end of the vertical columns.

4. The plasma display device of claim 3 wherein the supporting rack is made of metallic material and part of the adhesive material has good heat conductivity such that part of the heat generated at the rear side of the plasma display panel is conducted into the vertical columns of the supporting rack.

5. The plasma display device of claim 1 wherein the rear side of the plasma display panel comprises a heat dissipation layer for dissipating the heat generated at the rear side of the plasma display panel into the plurality of heat dissipation channels.

6. The plasma display device of claim 5 wherein the heat dissipation layer comprises metallic material for facilitating heat dissipation and EMI shielding.

7. The plasma display device of claim 5 wherein the heat dissipation layer comprises metallic material for reflecting light from the plasma display panel back to itself.

8. The plasma display device of claim 1 further comprising a plurality of electric fans for pumping cold air into bottom ends of the heat dissipation channels from outside of the plasma display device.

9. The plasma display device of claim 1 wherein the bottom beam comprises an internal air ventilation channel, a plurality of air ventilation holes on its upper surface for guiding the air inside the air ventilation channel into the heat dissipation channels, and two electric fans for pumping cold air from outside of the plasma display device into the air ventilation channel through two ends of the bottom beam.

10. The plasma display device of claim 1 further comprising a plurality of electric fans for pumping hot air on top of the heat dissipation channels out of the plasma display device.

11. The plasma display device of claim 1 wherein the top beam comprises an internal air ventilation channel, a plurality of ventilation holes on its lower surface for guiding hot air in the heat dissipation channels into the air ventilation channel, and two electric fans installed at left and right sides for pumping the hot air in the air ventilation channel out of the plasma display device from two ends of the top beam.

12. A plasma display device comprising:

a plasma display panel having a front side and a rear side, the front side of the plasma display panel being used for displaying images;

a rectangular side frame comprising upper, lower, left and right bars over which the plasma display panel is vertically installed at a front end of the four bars of the side frame;

a rear plate vertically installed in a rear end of the four bars of the side frame;

a circuit board electrically connected to the plasma display panel for controlling image displays of the plasma display device, the circuit board having a first width; and a supporting rack installed inside the side frame between the plasma display panel and the rear plate comprising a horizontal top beam fixed at the upper bar of the side frame, a horizontal bottom beam fixed at the lower bar of the side frame, and a plurality of vertical columns mounted between the top beam and bottom beam, the rear side of the plasma display panel being fixed on a front end of the plurality of vertical columns;

wherein a heat dissipation channel is formed between two neighboring vertical columns, and the heat dissipation channel has a second width, wherein, the first width is smaller than the second width so that the circuit board is positioned within the heat dissipation channel formed between two neighboring vertical columns, and the circuit board thus is spaced apart from the plasma display panel and the rear plate.

* * * * *